(12) United States Patent
Yamasaki

(10) Patent No.: US 8,212,356 B2
(45) Date of Patent: Jul. 3, 2012

(54) SEMICONDUCTOR DEVICE HAVING MULTI-LAYERED WIRING LAYER AND FABRICATION PROCESS THEREOF

(75) Inventor: Yasuo Yamasaki, Shiojiri (JP)

(73) Assignee: Seiko Epson Corporation (JP)

( * ) Notice: Subject to any disclaimer, the term of this patent is extended or adjusted under 35 U.S.C. 154(b) by 51 days.

(21) Appl. No.: 12/873,570

(22) Filed: Sep. 1, 2010

(65) Prior Publication Data

US 2011/0115076 A1 May 19, 2011

(30) Foreign Application Priority Data

Nov. 17, 2009 (JP) ................... 2009-262166

(51) Int. Cl.
*H01L 23/498* (2006.01)
*H01L 21/68* (2006.01)
*H01L 21/58* (2006.01)

(52) U.S. Cl. ......... 257/737; 257/E23.068; 257/E21.507; 257/E21.499; 257/738; 257/734; 257/788; 257/784

(58) Field of Classification Search ............. 257/737, 257/738, 734, 778, 784, E23.068, E21.507, 257/E21.499; 438/125, 614
See application file for complete search history.

(56) References Cited

U.S. PATENT DOCUMENTS

| 5,236,869 | A | 8/1993 | Takagi et al. | |
|---|---|---|---|---|
| 7,122,896 | B2 | 10/2006 | Saito et al. | |
| 7,763,536 | B2 * | 7/2010 | Yamasaki et al. | 438/614 |
| 2005/0062153 | A1 | 3/2005 | Saito et al. | |
| 2006/0286790 | A1 * | 12/2006 | Yamasaki et al. | 438/612 |
| 2007/0029671 | A1 * | 2/2007 | Yamasaki | 257/737 |
| 2011/0136337 | A1 * | 6/2011 | Yamasaki et al. | 438/618 |

FOREIGN PATENT DOCUMENTS

| JP | 58-086724 | 5/1983 |
|---|---|---|
| JP | 04-259242 | 9/1992 |
| JP | 3400263 | 2/2003 |
| JP | 2005-101527 | 4/2005 |
| JP | 2008-187021 | 8/2008 |

* cited by examiner

*Primary Examiner* — A O Williams
(74) *Attorney, Agent, or Firm* — Harness, Dickey & Pierce, P.L.C.

(57) ABSTRACT

A semiconductor device having a multi-layered wiring layer includes a semiconductor substrate, an electrode that is provided on the semiconductor substrate, an insulating film that is provided on the semiconductor substrate, the insulating film having an aperture at least partly overlapping the electrode, a resin bump that is provided on the insulating film, and the wiring layer that is electrically connected to the electrode and that includes a first conductive layer, an intermediate layer, and a second conductive layer. The first conductive layer is formed on the electrode and on the resin bump, the intermediate layer is formed on the first conductive layer, and the second conductive layer formed on the intermediate layer.

9 Claims, 7 Drawing Sheets

SEMICONDUCTOR DEVICE HAVING MULTI-LAYERED WIRING LAYER AND FABRICATION PROCESS THEREOF

The entire disclosure of Japanese Patent Application No. 2009-262166, filed Nov. 17, 2009 is expressly incorporated by reference herein.

BACKGROUND

1. Technical Field

The present invention relates to semiconductor devices, electronic components, and fabrication processes thereof.

2. Related Art

A semiconductor device that includes external terminal having a resin bump and a wire formed on the resin bump is known (JP-A-2005-101527; Patent Document 1). For example, this type of semiconductor device is mounted as a driving semiconductor device on a glass or plastic wiring substrate of an electronic component such as a liquid crystal display device. Because of the elastic force of the resin bump of the external terminal, such semiconductor device allow the external terminal to be electrically connected to the wiring substrate under applied pressure without causing physical damage, and thus ensure conduction.

It is known that the wiring structure of the external terminal in such semiconductor device is a bilayer structure of a base wiring layer and a surface wiring layer of different metals (Patent Document 1).

The materials of such wiring structures are such that, for example, metallic materials that provide good adhesion for the resin material can be used for the base wiring layer in direct contact with the resin bumps, and that stable metallic materials with good conductivity, and that have corrosion resistance and oxidation resistance can be used for the surface wiring layer.

However, the different metallic materials of the wiring structure have the possibility of causing interdiffusion of the metallic elements at the interface region between the base wiring layer and the surface wiring layer. There is also a possibility that the moisture or oxygen contained in the resin bumps may lower the reliability of the base wiring layer in contact with the resin material.

SUMMARY

An advantage of some aspects of the invention is to provide a semiconductor device having improved reliability.

Another advantage of some aspects of the invention is to provide a reliable electronic component that includes the semiconductor device.

Still another advantage of some aspects of the invention is to provide a reliable fabrication process of a semiconductor device.

Yet another advantage of some aspects of the invention is to provide a reliable fabrication process of an electronic component.

1. A semiconductor device according to an aspect of the invention includes:

a semiconductor substrate that has a first surface and a second surface opposite to the first surface;

an electrode that is provided on the first surface of the semiconductor substrate;

an insulating film that is provided on the first surface of the semiconductor substrate, the insulating film having an aperture at least partly overlapping the electrode;

a resin bump that is provided on the insulating film; and a wiring layer that is electrically connected to the electrode, and a part of the wiring layer being provided on the resin bump, the wiring layer including a first conductive layer formed on the electrode and on the resin bump, and a second conductive layer formed on the first conductive layer, the first conductive layer including a first surface on the side of the semiconductor substrate, and a second surface on the side of the second conductive layer, and a first oxide film or a first nitride film that is provided on the second surface of the first conductive layer.

The term "on" is used in the context of the present invention to mean that, for example, a specific member (hereinafter "B") is formed on another specific member (hereinafter, "A"). Further, the term "on" is used in the context of the present invention to be inclusive of B being directly formed on A, and B being formed on A via something else. Likewise, the term "under" is intended to be inclusive of B being directly formed under A, and B being formed under A via something else.

According to the aspect of the invention, an intermediate layer as an oxide film or a nitride film of the first conductive layer is formed at the interface between the first conductive layer and the second conductive layer. The intermediate layer can act as a diffusion prevention layer to prevent interdiffusion of the constituting elements at the interface between the first conductive layer and the second conductive layer. The wiring reliability of the semiconductor device can thus be improved.

2. According to another aspect of the invention, a second oxide film or a second nitride film is formed on the first surface of the first conductive layer in a region in contact with the resin bump.

In this way, a base layer as the oxide film or nitride film of the first conductive layer is formed at the contact face between the first conductive layer and the resin bump. The base layer can protect the first conductive layer from the metallic corrosion due to the moisture of the resin bump, or from the chemical action of the oxygen or nitrogen from the resin bump. The wiring reliability of the semiconductor device can thus be improved.

3. According to still another aspect of the invention, the second oxide film or the second nitride film may be formed throughout the first surface of the first conductive layer.

4. According to yet another aspect of the invention, the first conductive layer may include any one of titanium, nickel, chromium, and tungsten, and the second conductive layer may include any one of gold, platinum, and copper.

5. An electronic component according to still yet another aspect of the invention is electrically connected to any of the semiconductor devices above.

According to this aspect of the invention, an electronic component can be provided that is electrically connected to the reliable semiconductor device. Thus, a reliable electronic component can be provided.

6. A semiconductor device fabrication process according to further another aspect of the invention includes:

preparing a structure that includes: a semiconductor substrate that has a first surface and a second surface opposite to the first surface; an electrode provided on the first surface of the semiconductor substrate; and an insulating film provided on the first surface of the semiconductor substrate, and the insulating film including an aperture at least partly overlapping the electrode;

forming a resin bump on the insulating film; and forming a wiring layer electrically connected to the electrode, and that is partly provided on the resin bump, wherein the forming of the wiring layer includes: forming on the electrode and on the resin bump a first conductive layer that has a first surface on the side of the semiconductor substrate, and a second surface on the side opposite from the semiconductor substrate; forming on the second surface of the first conductive layer a first oxide film of the first conductive film or a first nitride film of the first conductive film; and forming a second conductive layer on the first oxide film or the first nitride film of the first conductive layer.

According to this aspect of the invention, a reliable semiconductor device fabrication process can be provided.

According to this aspect of the invention, a film having a barrier effect, such as the diffusion prevention effect, can be formed at the interface between the first conductive layer and the second conductive layer, using only the material of the first conductive layer and the second conductive layer. Thus, a semiconductor device fabrication process with improved productivity can be provided.

7. According to still further another aspect of the invention, the forming of the wiring layer may further include forming a second oxide film or a second nitride film on the first surface of the first conductive layer, wherein the forming of the second oxide film or the second nitride film may include forming a conductive layer of the same material as the first conductive layer prior to the forming of the first conductive layer, and heating the conductive layer in an atmosphere of oxygen or nitrogen.

8. According to yet further another aspect of the invention, the formation of the wiring layer may further include forming a third oxide film of the first conductive layer or a third nitride film of the first conductive layer, the third oxide film or the third nitride film being formed on the first surface of the first conductive layer in a region in contact with the resin bump, wherein the third oxide film or the third nitride film may be formed by heating the first conductive layer in an atmosphere of oxygen or nitrogen.

9. An electronic component fabrication process according to still yet further another aspect of the invention includes:

preparing a semiconductor device fabricated by any of the semiconductor device fabrication processes above; and electrically connecting the semiconductor device to a wiring substrate.

According to this aspect of the invention, a fabrication process of an electronic component that includes the reliable semiconductor device can be provided.

BRIEF DESCRIPTION OF THE DRAWINGS

The invention will be described with reference to the accompanying drawings, wherein like numbers reference like elements.

DESCRIPTION OF EXEMPLARY EMBODIMENT

An exemplary embodiment of the invention is described below with reference to the accompanying drawings. Note that the invention is not limited to the descriptions of the following embodiment. The invention encompasses any combination of the following embodiment and its variations.

1. Semiconductor Device

A semiconductor device according to First Embodiment is described below with reference to the drawings.

Figure 1A:
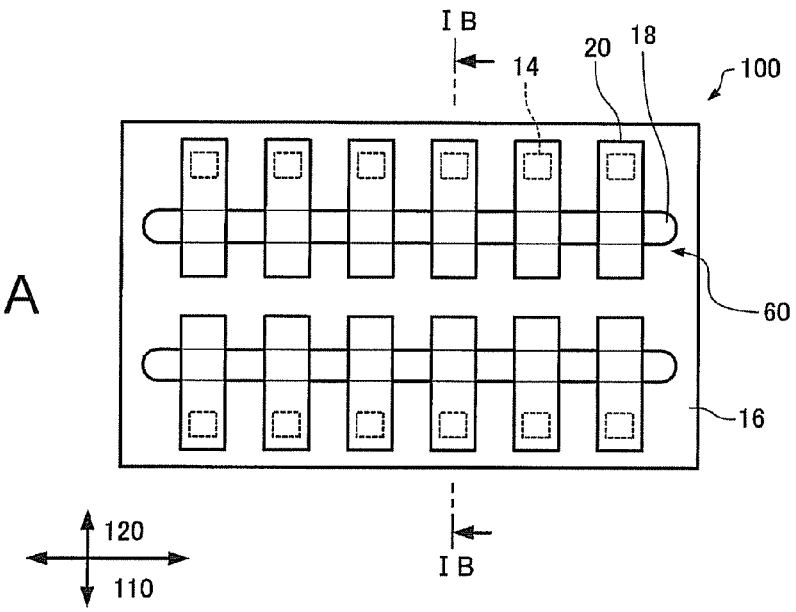
FIG. 1A and FIG. 1B are plan views and a cross sectional view, respectively, schematically illustrating a relevant part of a semiconductor device according to an embodiment of the invention.
Figure 1B:
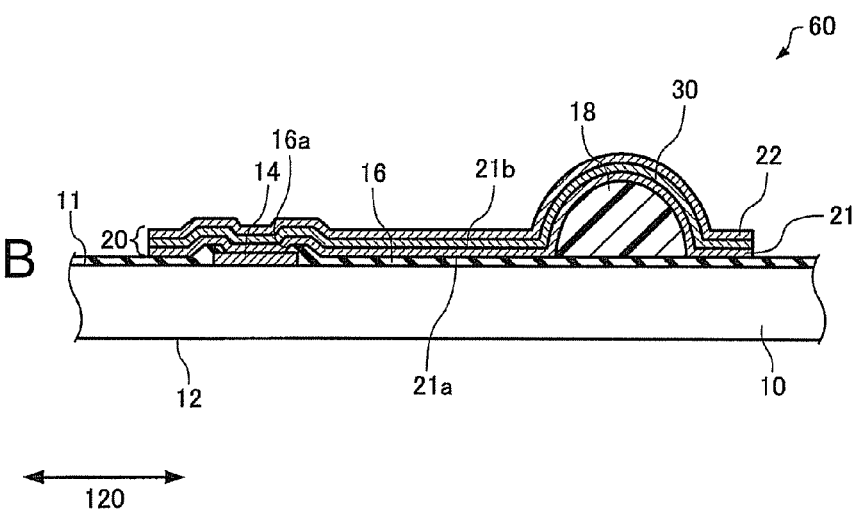

FIG. 1A is a plan view schematically illustrating a semiconductor device 100 according to the present embodiment. FIG. 1B is a cross sectional view schematically illustrating a relevant part of the semiconductor device 100 of FIG. 1A at IB-IB.

As illustrated in FIG. 1A, a semiconductor substrate 10 may have a form of a chip. That is, the semiconductor substrate 10 may be a semiconductor chip. Alternatively, the semiconductor substrate 10 may be in the form of a wafer that includes a plurality of semiconductor substrates 10 (not illustrated). For example, the semiconductor substrate 10 may be a silicon substrate. The semiconductor substrate 10 includes an integrated circuit, though not illustrated. The configuration of the integrated circuit is not particularly limited, and, for example, active elements such as transistors, or passive elements such as resistors, coils, and capacitors may be included.

When provided as a chip, the semiconductor substrate 10 includes, as illustrated in FIG. 1B, a first surface 11, and a second surface 12 on the other side. As illustrated in FIG. 1A and FIG. 1B, the first surface 11 is the surface on which a plurality of external terminals 60 is formed.

The external terminals 60 may be formed in any region on the first surface 11. For example, as illustrated in FIG. 1A, the external terminals 60 may be provided along the longer side of the first surface 11 when the first surface 11 is rectangular in shape. Further, though not illustrated, the external terminals 60 may be provided along the shorter side (the side shorter than the longer side) of the first surface 11. Further, though not illustrated, the external terminals 60 may be provided on the first surface 11 in regions where the integrated circuit is formed, or in regions where the integrated circuit is not formed.

As illustrated in FIG. 1A and FIG. 1B, the semiconductor device 100 includes electrodes 14 on the first surface 11. The electrodes 14 may be electrically connected to the integrated circuit inside the semiconductor substrate 10 via internal wires (not illustrated). The electrodes 14 may be part of the internal wires of the semiconductor substrate 10.

The electrodes 14 may be formed in any region on the first surface 11, as long as the electrodes 14 are on the first surface 11. The electrodes 14 may be formed above the region where the integrated circuit is formed. Alternatively, the electrodes 14 may be formed in regions where the integrated circuit is not formed. The electrodes 14 may be plural, as illustrated in FIG. 1A. Further, the electrodes 14 may be disposed along the longer side of the first surface 11.

The material of the electrodes 14 is not particularly limited, as long as it is conductive. For example, the electrodes 14 may be formed of metals such as aluminum (Al) and copper (Cu).

The electrodes 14 may be a single conductive layer, or a laminate of a plurality of conductive layers including a barrier layer that prevents diffusion of metals such as aluminum.

As illustrated in FIG. 1B, the semiconductor device 100 includes an insulating film 16. The insulating film 16 may be a passivation film. The insulating film 16 may be formed in such a manner that at least part of the electrodes 14 is exposed on the first surface 11. Specifically, the insulating film 16 may have apertures 16a that at least partly overlap the electrodes 14. The insulating film 16 is not particularly limited, as long as it is an electrically insulating film. For example, the insulating film 16 may be an inorganic insulating film such as $SiO_2$ and SiN. Alternatively, the insulating film 16 may be an organic insulating film such as polyimide resin.

The external terminals 60 according to the present embodiment are described below.

As illustrated in FIG. 1B, the semiconductor device 100 includes a resin bump 18 formed on the insulating film 16. The position of the resin bump 18 is not particularly limited, and, as illustrated in FIG. 1A, the resin bump 18 is formed in the vicinity of the electrodes 14.

The shape of the resin bump 18 is not particularly limited. As illustrated in FIG. 1A, the resin bump 18 may be formed to extend in a specific direction. Further, as illustrated in FIG. 1A, the resin bump 18 may be formed to extend along the longer side of the first surface 11.

As used herein, the direction of extension of the resin bump 18 is a first direction 110, and the direction orthogonal to the first direction 110 is a second direction 120, as illustrated in FIG. 1A.

As illustrated in FIG. 1B, the surface of the resin bump 18 may be curved. The resin bump 18 may have a substantially semicircular cross sectional shape in the second direction 120, as illustrated in FIG. 1B. Further, though not illustrated, a depression may be formed in a portion of the resin bump 18 where a wiring layer 20 (described later) is not formed. The depth of the depression is not particularly limited. In this way, the distance between the wires of the external terminals can be increased to prevent migration. Further, the depression serves as an exit way for the adhesive used for the mounting of the semiconductor device pressed against a wiring substrate via the adhesive, allowing unnecessary portions of the adhesive to discharge with improved efficiency.

The material of the resin bump 18 is not particularly limited, and any known resin material can be used. For example, the resin bump 18 may be formed using a known photosensitive resin material. Specific examples of resins usable for the resin bump 18 include polyimide resin, silicone-modified polyimide resin, epoxy resin, silicone-modified epoxy resin, benzocyclobutene (BCB), polybenzoxazole (PBO), and phenol resin.

As illustrated in FIG. 1A and FIG. 1B, the semiconductor device 100 includes a wiring layer 20 electrically connected to the electrode 14, and that is partly provided on the resin bump 18. Specifically, as illustrated in FIG. 1A and FIG. 1B, the wiring layer 20 is provided in a manner allowing it to be electrically connected to the electrode 14 inside the aperture 16a of the insulating film 16, and to extend over the insulating film 16 from the aperture 16a and cover the resin bump 18. As illustrated in FIG. 1B, the wiring layer 20 is provided to cover the thickest portion of the resin bump 18.

As illustrated in FIG. 1B, the wiring layer 20 includes a first conductive layer 21 and a second conductive layer 22. The first conductive layer 21 is a conductive layer between the second conductive layer 22 and the semiconductor substrate 10, and may be provided as the base wiring layer of the wiring layer 20. The second conductive layer 22 is a conductive layer formed on the first conductive layer 21, and may be provided as a surface wiring layer of the wiring layer 20.

As illustrated in FIG. 1B, the first conductive layer 21 includes a first surface 21a on the side of the semiconductor substrate 10, and a second surface 21b on the side of the second conductive layer 22. The first surface 21a may be a surface that faces the semiconductor substrate 10, and that is in contact with, for example, the electrode 14 or the resin bump 18.

The material of the first conductive layer 21 is not particularly limited, as long as it is a conductive layer material that adheres well to materials such as resin. Specifically, the conductive layer 21 may be a layer that includes at least one of, for example, titanium (Ti), titanium-tungsten (TiW), nickel (Ni), chromium (Cr), and tungsten (W).

The second conductive layer 22 is formed of a material having a higher conductivity than the first conductive layer 21. The material of the second conductive layer 22 may be metals more stable than the material of the first conductive layer 21, and that have corrosion resistance and oxidation resistance. Specifically, the second conductive layer 22 may be a layer that includes at least one of, for example, gold (Au), platinum (Pt), and copper (Cu).

As illustrated in FIG. 1B, the wiring layer 20 includes an intermediate layer 30 between the second surface 21b of the first conductive layer 21 and the second conductive layer 22. The intermediate layer 30 may be formed throughout the second surface 21b of the first conductive layer 21.

The intermediate layer 30 is an oxide film or a nitride film of the first conductive layer 21. Further, the intermediate layer 30 may be an oxynitride film of the first conductive layer 21. Specifically, the intermediate layer 30 may be a barrier layer that prevents defects such as interdiffusion at the interface between the first conductive layer 21 and the second conductive layer 22. For example, when the first conductive layer 21 is titanium (Ti), the intermediate layer 30 may be titanium oxide ($TiO_2$) or titanium nitride (TiN). Further, for example, when the first conductive layer 21 is chromium (Cr), the intermediate layer 30 may be chromium oxide ($Cr_2O_3$, $CrO_3$, $CrO_2$) or chromium nitride (CrN).

The intermediate layer 30 has such a thickness that it can prevent the interdiffusion of metallic elements between the first conductive layer 21 and the second conductive layer 22, and that it does not interfere with the conduction between the electrode 14 and the second conductive layer 22. For example, when the thickness of the first conductive layer 21 is from 50 nm to 1,000 nm, inclusive, the intermediate layer 30 has a thickness of from 5 nm to 100 nm, inclusive. In this way, the metallic diffusion between the first conductive layer 21 and the second conductive layer 22 can be reliably prevented while ensuring desirable conduction for the wiring layer 20 and allowing the wiring layer 20 to deform during mounting.

The semiconductor device 100 having the external terminals 60 can be configured in the manner described above.

The semiconductor device 100 according to the present embodiment has the following feature, for example.

According to the embodiment of the invention, the intermediate layer 30, an oxide film or a nitride film of the first conductive layer 21, is provided on the second surface 21b in contact with the second conductive layer 22. The gold (Au) and titanium (Ti) used for the first conductive layer 21 and the second conductive layer 22 are active metallic elements. Thus, the interdiffusion at the interface can be prevented by the provision of the intermediate layer 30 between the first conductive layer 21 and the second conductive layer 22. In this way, there will be no formation of instable compounds or solid solutions between the first conductive layer 21 and the second conductive layer 22 over time, and the reliability of the wiring layer 20 can be improved.

The semiconductor device 100 is therefore highly reliable.

First Variation

Figure 2A:
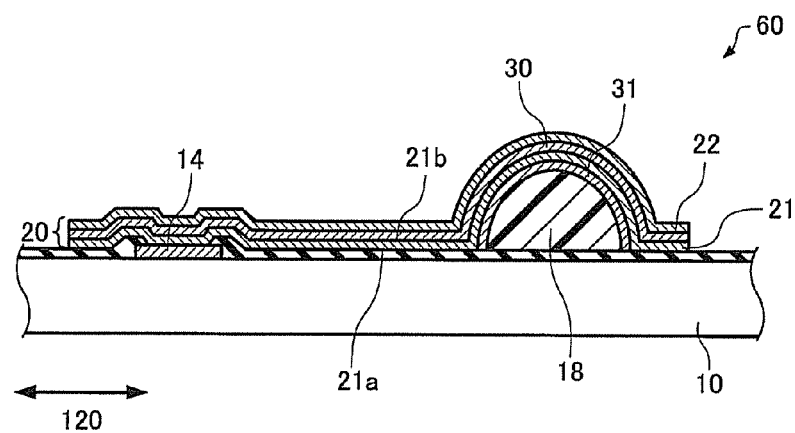
FIG. 2A and FIG. 2B are plan views schematically illustrating a variation of the relevant part of the semiconductor device according to the embodiment of the invention.
Figure 2B:
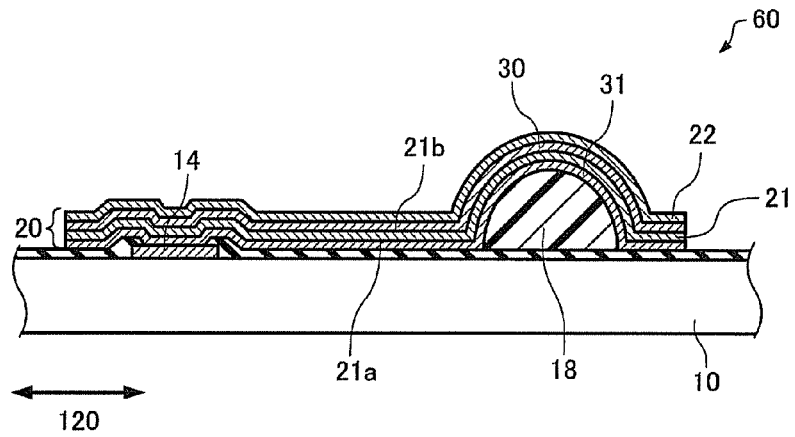

An example of a variation of the semiconductor device 100 according to the present embodiment is illustrated in FIGS. 2A and 2B.

As illustrated in FIG. 2A, a base layer 31 may be formed on the first surface 21a of the first conductive layer 21 in at least a region in contact with the resin bump 18. The base layer 31 is an oxide film or a nitride film of the first conductive layer 21. Specifically, the base layer 31 in a region of the first conductive layer 21 in contact with the resin bump 18 may serve as a barrier layer that prevents the first conductive layer 21 from being corroded or affected in other ways by factors such as the moisture contained in the resin bump 18. Details of the base layer 31 are essentially the same as those described for the intermediate layer 30, and will not be described. For example, the intermediate layer 30 and the base layer 31 may be made of the same material.

By the provision of the base layer as an oxide film or nitride film of the first conductive layer 21 at the contact face between the first conductive layer 21 and the resin bump 18, the first conductive layer 21 can be protected from the metallic corrosion caused over time by the moisture of the resin bump 18, or from the chemical action of the oxygen or nitrogen from the resin bump 18 over time. In this way, the reliability of the wiring layer 20 can be further improved.

Second Variation

As illustrated in FIG. 2B, the base layer 31 may be formed throughout the first surface 21a of the first conductive layer 21. In other words, the base layer 31 may be the lowermost layer of the wiring layer 20.

By the provision of the base layer 31 throughout the first surface 21a including the contact face with the resin bump 18 of the first conductive layer 21, the first conductive layer 21 can be more reliably protected from the metallic corrosion caused over time by the moisture of the resin bump 18, or from the chemical action of the oxygen or nitrogen from the resin bump 18 over time. In this way, the reliability of the wiring layer 20 can be improved even more effectively.

2. Semiconductor Device Fabrication Process

A semiconductor device fabrication process according to the present embodiment is described below with reference to the accompanying drawings.

FIG. 3A to FIG. 3D, and FIG. 4A to FIG. 4E are schematic cross sectional views representing an example of a semiconductor device fabrication process according to the present embodiment.

Figure 3A:
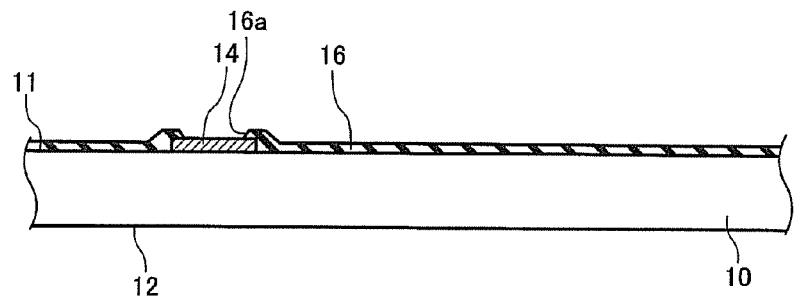
FIGS. 3A to 3D are schematic cross sectional views representing a semiconductor device fabrication process according to the embodiment of the invention.

As illustrated in FIG. 3A, a structure is prepared that includes: a semiconductor substrate 10 (a semiconductor wafer or chip) having a first surface on one side and a second surface on the other side; electrodes 14 provided on the first surface 11 of the semiconductor substrate 10; and an insulating film 16 provided on the first surface 11 of the semiconductor substrate 10, and that has apertures 16a that at least partly overlap the electrodes 14. Though not illustrated, an integrated circuit is formed inside the semiconductor substrate 10. The semiconductor substrate 10, the electrodes 14, and the insulating film 16 were already described in detail, and will not be described further.

Figure 3B:
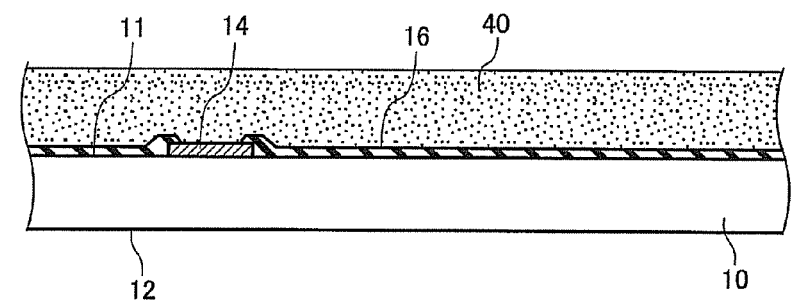

As illustrated in FIG. 3B, a resin material film 40 of a resin precursor composition is formed on the electrodes 14 and the insulating film 16. The resin material film 40 may be a heat-curable resin composition having a thermosetting property, or a photosensitive resin composition having a photosensitive property. The following description of the exemplary fabrication process of the present embodiment will be given through the case where the resin material film 40 has a photosensitive property.

The resin material film 40 may be formed by being applied throughout over the first surface 11 of the semiconductor device 10. The resin material film 40 may be prebaked after application. Further, the resin material film 40 may be in the form of, for example, a sheet. The resin material film 40 may be a resin such as polyimide resin, silicone-modified polyimide resin, epoxy resin, silicone-modified epoxy resin, benzocyclobutene (BCB), polybenzoxazole (PBO), phenol resin, and acrylic resin.

Figure 3C:
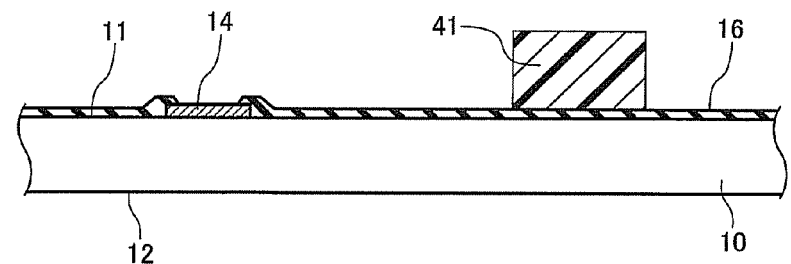

Then, as illustrated in FIG. 3C, the resin material film 40 is exposed using an exposure device such as a mask (not illustrated), followed by development using a developer. The resin material film 40 is then patterned to form a resin layer 41.

The resin layer 41 becomes the resin bump 18 upon curing. Though not illustrated, the resin layer 41 may be formed to extend along the first direction 110. For example, the resin layer 41 may be formed to extend along the longer side of the semiconductor substrate 10 (see FIGS. 1A and 1B).

The exposure and development in this step may be performed using a known photolithography technique. For example, when the resin material film 40 is a positive resist, the mask (not illustrated) is disposed so that the resin material film 40 is exposed in regions where the resin bumps 18 are formed. When the resin material film 40 is a negative resist, the mask may be disposed in regions where the resin bumps 18 are formed. The mask is a light-shielding mask, and may be, for example, a glass plate with a light shielding film of, for example, chromium. After the mask is disposed at a predetermined position, exposure is performed by irradiation of, for example, ultraviolet rays from a light-source lamp (not illustrated). The developer used for development may be a known developer with which an unnecessary resin layer can be removed. For example an organic alkaline developer can be used.

Figure 3D:
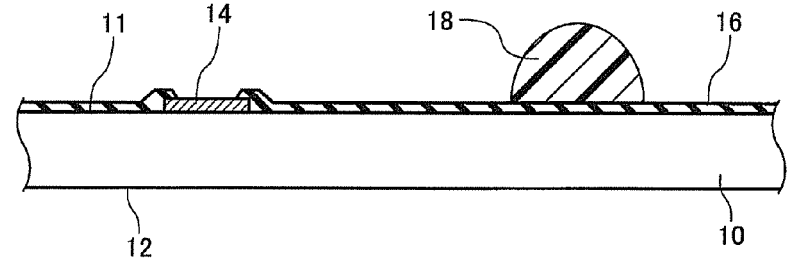

The step of forming the resin bump 18 further includes the step of heating (curing) the resin layer 41 so as to deform the resin layer 41, as illustrated in FIG. 3D.

A means of heating is not particularly limited, and may be irradiation of infrared rays from a heat source (not illustrated). The applied heat lowers the viscosity of the resin layer 41, and the resin layer 41 deforms by being acted upon by its own weight and the surface tension. As a result, as illustrated in FIG. 3D, the resin bump 18 is formed that has a smooth, curved top surface, and a substantially semicircular cross section.

Figure 4A:
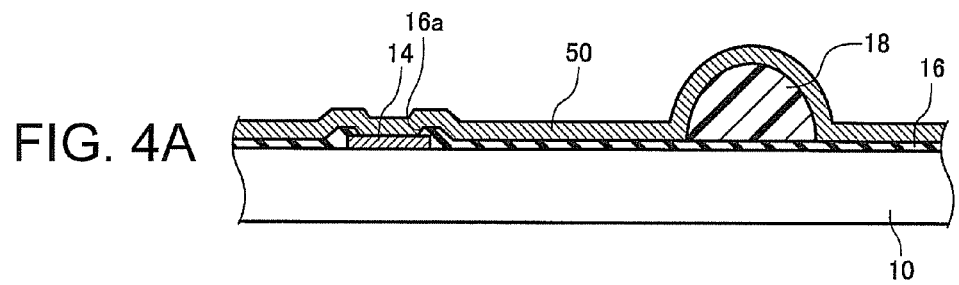
FIGS. 4A to 4E are schematic cross sectional views representing the semiconductor device fabrication process according to the embodiment of the invention.

Thereafter, as illustrated in FIG. 4A, a first conductive film 50 is formed that continuously covers the electrode 14, the insulating film 16, and the resin bump 18 above the first surface 11. The first conductive film 50 is a film that forms the first conductive layer 21. Accordingly, the material and configuration of the first conductive film 50 are the same as those already described for the first conductive film 21, and will not be described further. The deposition method of the first conductive film 50 is not particularly limited, and known deposition methods can be used. For example, the first conductive film 50 may be formed by sputtering.

The first conductive film 50 has a thickness thicker than the desired thickness of the first conductive layer 21. Specifically, the first conductive film 50 is formed in a thickness equal to the combined thickness of the first conductive layer 21 and the intermediate layer 30.

Figure 4B:
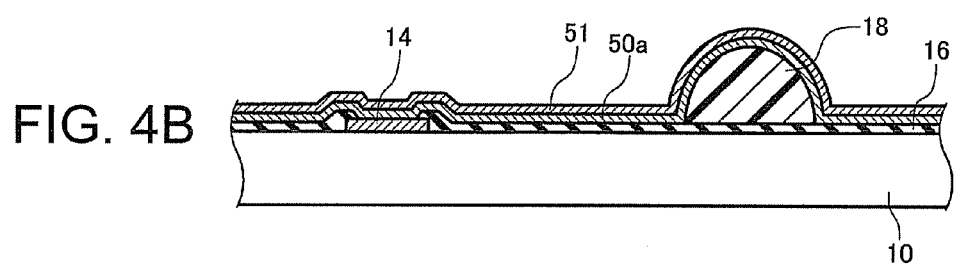

Then, as illustrated in FIG. 4B, the surface of the first conductive film 50 is subjected to an oxidation treatment or a nitridation treatment to form an intermediate film 51. The methods of oxidation treatment and nitridation treatment are not particularly limited, and known methods can be used. For example, in the case of oxidation treatment, the first conductive film 50 may be heated in an oxygen atmosphere. In the case of nitridation treatment, the first conductive film 50 may be heated in a nitrogen atmosphere, for example. Specifically, in oxidation treatment, the first conductive film 50 may be heated in a temperature range of from, for example, 100° C. to 300° C., inclusive, while introducing nitrogen, oxygen, or an atmosphere into an oxygen chamber or the like. In this way, the intermediate film 51 can be formed as a dense oxide or nitride film.

As illustrated in FIG. 4B, as a result of forming the intermediate film 51 of the desired thickness on the surface of the first conductive film 50, a first conductive film 50a having the thickness of the first conductive layer 21 is formed.

Figure 4C:
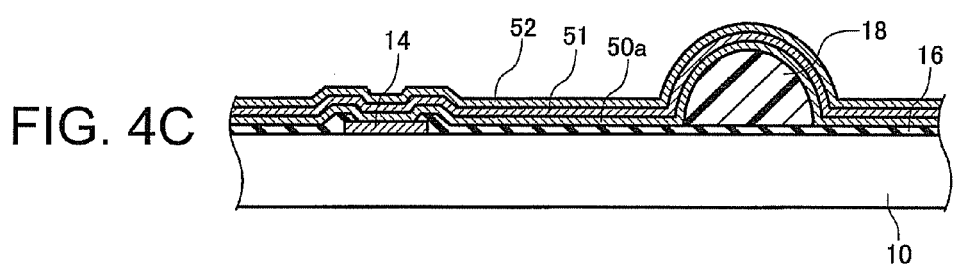

Thereafter, as illustrated in FIG. 4C, a second conductive film 52 is formed on the intermediate film 51. The second conductive film 52 is a film that forms the second conductive layer 22. Accordingly, the material and configuration of the second conductive film 52 are the same as those already described for the second conductive film 22, and will not be described further. The deposition method of the second conductive film 52 is not particularly limited, and known deposition methods can be used. For example, the second conductive film 52 may be formed by sputtering.

Figure 4D:
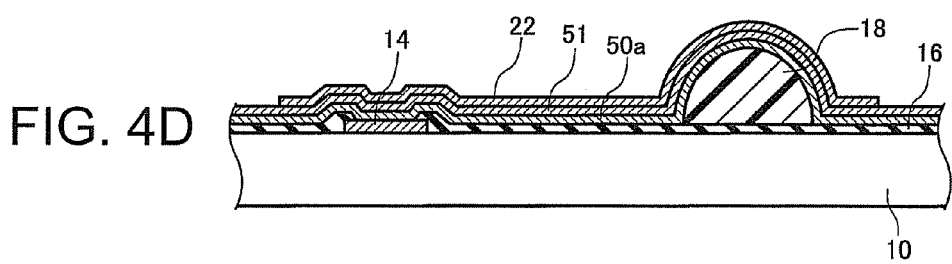

Then, as illustrated in FIG. 4D, the second conductive film 52 is patterned into a desired shape to form the second conductive layer 22. Here, the second conductive film 52 is patterned into the shape of the wiring layer 20.

Figure 4E:
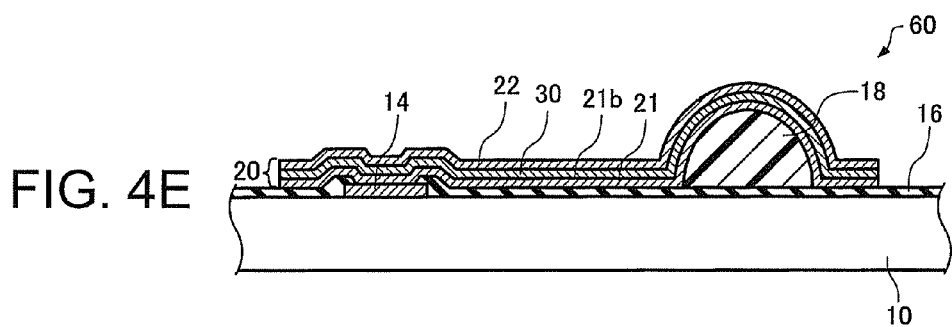

Thereafter, as illustrated in FIG. 4E, the intermediate film 51 and the first conductive film 50a are patterned to form the first conductive layer 21, and the intermediate layer 30 provided between the first conductive layer 21 and the second conductive layer 22, using the second conductive layer 22 as an etching mask. As a result, as illustrated in FIG. 4E, the semiconductor device 100 can be fabricated that includes the intermediate layer 30 formed on the second surface 21b of the first conductive layer 21.

When the semiconductor substrate 10 is a semiconductor wafer, the substrate may be cut into a predetermined size to obtain the semiconductor device 100, after forming first and second wiring layers 25 and 35 (not illustrated).

The fabrication process of the semiconductor device 100 having the external terminals 60 can be configured in the manner described above.

The fabrication process of the semiconductor device 100 according to the present embodiment has the following feature, for example.

According to the embodiment of the invention, a highly reliable fabrication process of the semiconductor device 100 can be provided.

Further, according to the embodiment of the invention, the intermediate layer 30 can be formed from the material used for first conductive layer 21. Because the same material is used, the material of the first conductive layer 21 is all that is required, and it is not required to provide an additional material for the barrier layer that has effects such as the diffusion prevention effect. This improves the productivity of the semiconductor device fabrication process.

First Variation

Figure 5A:
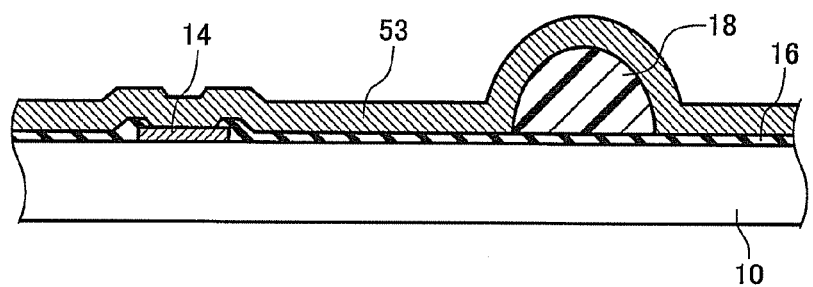
FIGS. 5A to 5C are schematic cross sectional views representing a variation of the semiconductor device fabrication process according to the embodiment of the invention.
Figure 5B:
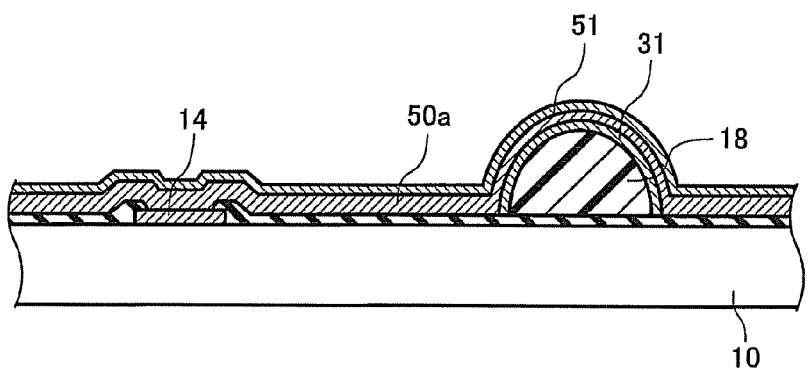
Figure 5C:
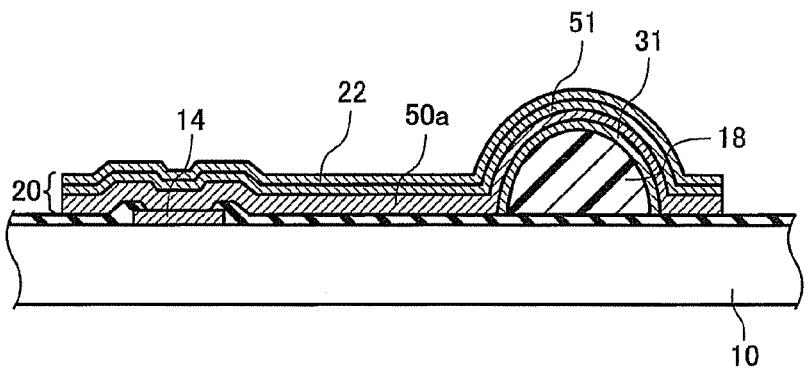

A variation of the semiconductor device fabrication process according to the present embodiment is described below with reference to the accompanying drawings. FIG. 5A to FIG. 5C are schematic cross sectional views of a relevant part of the semiconductor device, explaining a variation of the semiconductor device fabrication process according to the present embodiment.

As illustrated in FIG. 5A, a semiconductor substrate 10 (a semiconductor wafer or chip) having the electrodes 14 and the insulating film 16 is prepared, and a third conductive film 53 is formed that continuously covers the electrodes 14, the insulating film 16, and the resin bumps 18. The configuration and material of the third conductive film 53 are the same as those described for the first conductive film 51, and will not be described further. In the fabrication process of this variation, the third conductive film 53 is formed in a thickness equal to the combined thickness of the intermediate layer 30, the base layer 31, and the first conductive layer 21.

Thereafter, as illustrated in FIG. 5B, the third conductive film 53 is heated, and subjected to an oxidation treatment or a nitridation treatment to form an intermediate film 51 on the surface of the third conductive film 53. Here, as illustrated in FIG. 5B, the heat treatment of the third conductive layer 53 in an atmosphere of oxygen or nitrogen can cause an oxidation reaction or a nitridation reaction on the surface of the third conductive film 53 in contact with the resin bump 18 that may contain oxygen or nitrogen. In other words, the oxidation treatment or nitridation treatment of the third conductive film 53 in a region of the third conductive film 53 in contact with the resin bump 18 may be performed using the oxygen or nitrogen contained in the resin bump 18. In this way, the base layer 31 can be formed in a region of the first conductive film 50a in contact with the resin bump 18.

Thereafter, the second conductive film 52 is formed in a step analogous to that shown in FIG. 4C of the present embodiment, though not illustrated (see FIG. 4C).

The second conductive film 52 is patterned into a desired shape to form the second conductive layer 22, and etching is performed using the second conductive layer 22 as a mask (see FIG. 4D and FIG. 4E). As a result, as illustrated in FIG. 5C, the semiconductor device 100 can be fabricated that includes the base layer 31 formed on the first surface 21a of the first conductive layer 21 in a region in contact with the resin bump 18.

This variation simplifies the fabrication steps by efficiently forming the base layer 31 on the first surface 21a of the first conductive layer 21 in a region in contact with the resin bump 18.

Though not illustrated, the base layer 31 may be formed on the first surface 21a of the first conductive layer 21 in a region in contact with the resin bump 18 by forming the third conductive film 53 of an equal thickness to the base layer 31 only on the resin bump 18, and by subjecting the third conductive film 53 to oxidation or nitridation treatment.

Second Variation

Figure 6A:
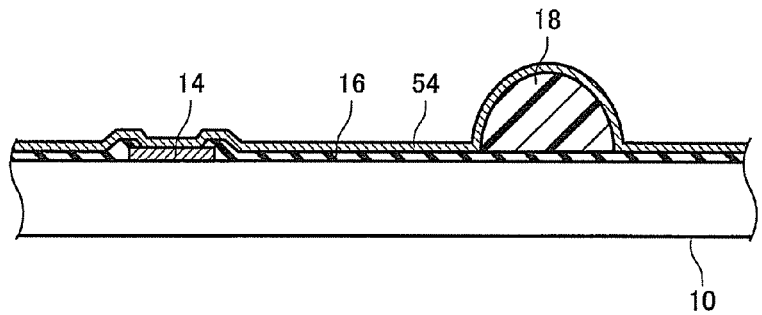
FIGS. 6A to 6D are schematic cross sectional views representing the variation of the semiconductor device fabrication process according to the embodiment of the invention.
Figure 6B:
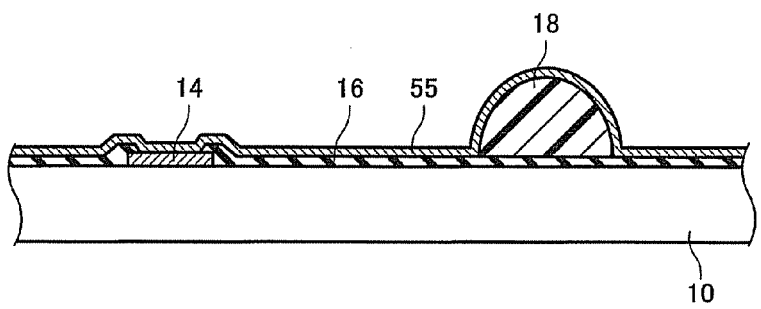
Figure 6C:
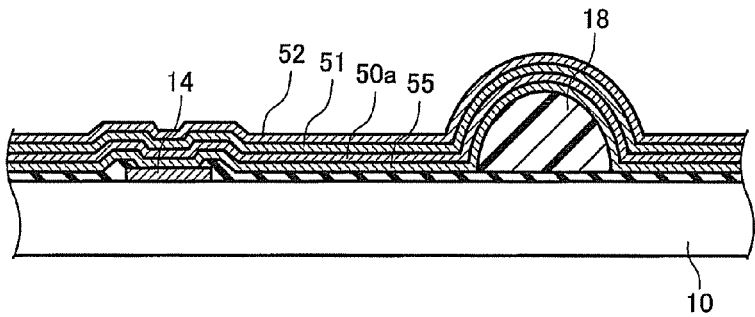

A variation of the semiconductor device fabrication process according to the present embodiment is described below with reference to the accompanying drawings. FIG. 6A to FIG. 6C are schematic cross sectional views of a relevant part of the semiconductor device, explaining a variation of the semiconductor device fabrication process according to the present embodiment.

As illustrated in FIG. 6A, a semiconductor substrate 10 (a semiconductor wafer or chip) having the electrodes 14 and the insulating film 16 is prepared, and a fourth conductive film 54 is formed that continuously covers the electrodes 14, the insulating film 16, and the resin bumps 18. The configuration and material of the fourth conductive film 54 are the same as those described for the first conductive film 51, and will not be described further. In the fabrication process of this variation, the fourth conductive film 54 is formed in a thickness equal to the thickness of the base layer 31.

Thereafter, as illustrated in FIG. 6B, the fourth conductive film 54 is subjected to an oxidation treatment or a nitridation treatment as a whole to form a base film 55. The method of oxidation or nitridation treatment is the same as the method of forming the intermediate film 51, and will not be described further.

Then, as illustrated in FIG. 6C, the first conductive film 50*a*, the intermediate film 51, and the second conductive film 52 are formed on the base film 55 by performing steps analogous to the steps in FIG. 4A to FIG. 4C of the present embodiment (see FIG. 4A to FIG. 4C).

Figure 6D:
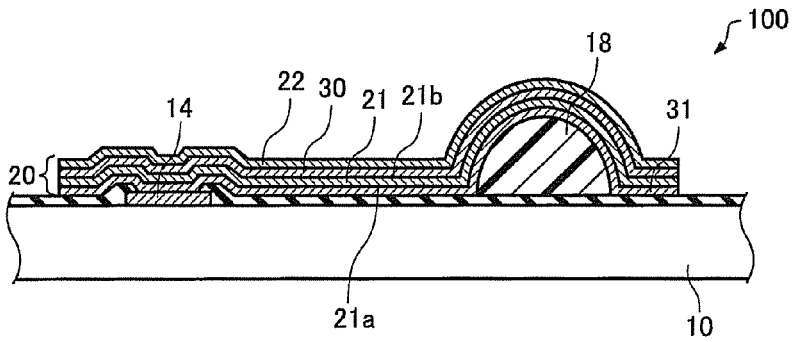

The second conductive film 52 is then patterned into a desired shape to form the second conductive layer 22, and etching is performed using the second conductive layer 22 as a mask (see FIG. 4D and FIG. 4E). As a result, as illustrated in FIG. 6D, the semiconductor device 100 can be fabricated that includes the base layer 31 formed on the first surface 21*a* of the first conductive layer 21.

The semiconductor device fabricated in this manner includes the base layer 31 formed throughout the first surface 21*a* of the first conductive layer 21, including the contact face with the resin bump 18. In other words, a semiconductor device fabrication process is provided with which the first conductive layer 21 can be reliably protected from the metallic corrosion caused over time by the moisture of the resin bump 18, or from the chemical action of the oxygen or nitrogen from the resin bump 18 over time. Thus, an even more reliable semiconductor device fabrication process can be provided.

3. Electronic Component and Fabrication Process

An electronic component and a fabrication process thereof according to the present embodiment are described below with reference to the accompanying drawings.

Figure 7:
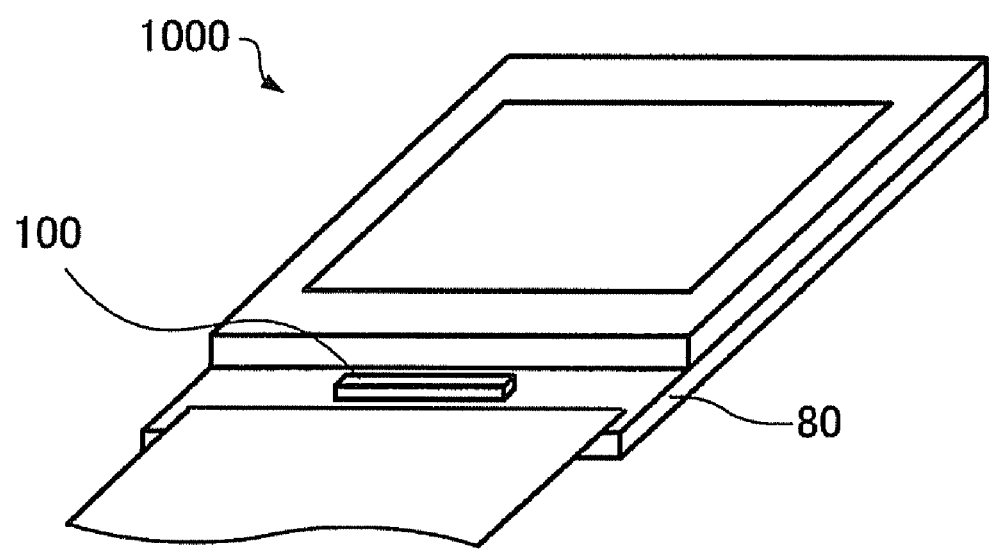
FIG. 7 is a perspective view schematically illustrating an example of an electronic component according to the embodiment of the invention.

FIG. 7 is a perspective view illustrating a display device as an example of an electronic component 1000 according to the present embodiment. The display device may be, for example, a liquid crystal display device or an EL (Electrical Luminescence) display device. The semiconductor device 100 may be a driver IC that controls the electronic component 1000 provided as a display device.

A fabrication process of the electronic component 1000 according to the present embodiment includes preparing the semiconductor device 100. The semiconductor device 100 may have any of the configurations described above.

The fabrication process of the electronic component 1000 according to the present embodiment includes preparing a wiring substrate 80. As illustrated in FIG. 7, the wiring substrate 80 is a substrate on which the semiconductor device 100 is mounted, and includes a wiring pattern and a base substrate (not illustrated).

The wiring pattern has electrical contacts. The electrical contacts are portions of the wiring pattern electrically connected to other components. The wiring pattern may be electrically connected to, for example, electrodes (scan electrodes, signal electrodes, and counter electrodes) that drive a liquid crystal. The wiring pattern may be a film of a metal or a metallic compound such as ITO (Indium Tin Oxide), aluminum (Al), copper (Cu), chromium (Cr), titanium (Ti), nickel (Ni), and titanium-tungsten (Ti—W), or a composite film of these. Further, the wiring pattern may be formed so as to be partly routed inside the base substrate.

The material and configuration of the base substrate are not particularly limited. For example, the base substrate may be a light-transmissive inorganic material. In this case, the base substrate may be a glass substrate or a ceramic substrate.

When the base substrate is a glass substrate, the wiring substrate 80 may be part of an electrooptic panel (such as a liquid crystal panel and an electroluminescence panel). Alternatively, the base substrate may be an organic material, specifically, a substrate or a film of polyethylene terephthalate (PET). Further, a flexible substrate of polyimide resin may be used as the base substrate. A tape used for the FPC (Flexible Printed Circuit) or TAB (Tape Automated Bonding) technique may be used as the flexible substrate.

The fabrication process of the electronic component 1000 according to the present embodiment includes mounting the semiconductor device 100 on the wiring substrate 80. In this step, the external terminals 60 of the semiconductor device 100 are brought into contact with the electrical contacts of the wiring pattern to provide electrical interconnections. As a result, the semiconductor device 100 is electrically connected to the wiring substrate 80.

The method of mounting the semiconductor device 100 on the wiring substrate 80 is not particularly limited, as long as the external terminals 60 can be pressed against the electrical contacts of the wiring substrate 80. For example, the semiconductor device 100 is disposed above the wiring substrate 80 in register therewith so that the external terminals 60 of the semiconductor device 100 face the wiring pattern of the wiring substrate 80. Then, an adhesive is placed between the first surface 11 of the semiconductor device 100 and the wiring substrate 80. The placement of the adhesive is not particularly limited: it may be placed in advance on the side of the wiring substrate 80, or may be placed on the side of the semiconductor device 100. The adhesive may be, for example, a film adhesive, an insulating adhesive, or a known NCF (Non-Conductive Film) adhesive.

Thereafter, the semiconductor device 100 and the wiring substrate 80 are pressed against each other to contact the external terminals 60 with the wiring pattern. Here, in response to the pressure applied on the semiconductor device 100 and the wiring substrate 80, the external terminals 60 can undergo elastic deformation. Because the external terminals 60 can be pressed against the electrical contacts as the elastic force of the resin bumps 18 relieves the generated stress, an electronic component with reliable electrical interconnections can be provided by ensuring the reliability of the semiconductor device.

After the semiconductor device 100 is mounted on the wiring substrate 80, the adhesive may be cured to form a bonding layer. The bonding layer may be used to maintain a distance between the semiconductor device 100 and the wiring substrate 80. Specifically, the bonding layer may be used to maintain the resin bumps 18 in the state of elastic deformation.

Optional steps, including testing and cutting, may be subsequently performed before completing the fabrication of the electronic component 1000 of the present embodiment.

The electronic component 1000 and the electronic component fabrication process according to the present embodiment have the following features, for example.

The electronic component 1000 according to the present embodiment includes the semiconductor device 100 that has high reliability, and therefore the electronic component 1000 is highly reliable.

The fabrication process of the electronic component 1000 according to the present embodiment includes mounting a highly reliable semiconductor device, and therefore the fabrication process can provide an electronic component with highly reliability.

While the invention has been described in detail with respect to a certain embodiment, a skilled person will understand that the invention may be altered in many ways without essentially departing from the novel features and advantages of the invention. All such variations are encompassed in the scope of the invention.

What is claimed is:

1. A semiconductor device comprising:
    a semiconductor substrate that has a first surface and a second surface opposite to the first surface;
    an electrode that is provided on the first surface of the semiconductor substrate;
    an insulating film that is provided on the first surface of the semiconductor substrate, the insulating film having an aperture at least partly overlapping the electrode;
    a resin bump that is provided on the insulating film; and
    a wiring layer that is electrically connected to the electrode, a part of the wiring layer being provided on the resin bump, the wiring layer that includes a first conductive layer, an intermediate layer, and a second conductive layer, wherein
    the first conductive layer is formed on the electrode and on the resin bump, the intermediate layer is formed on the first conductive layer, and the second conductive layer is formed on the intermediate layer.

2. The semiconductor device according to claim 1, further includes a base layer that is formed between the first conductive layer and the resin bump.

3. The semiconductor device according to claim 2, wherein the base layer is formed between the first conductive layer and the following three areas of the electrode, the insulating film, and the resin bump.

4. The semiconductor device according to claim 1, wherein the first conductive layer includes any one of titanium, nickel, chromium, and tungsten, and wherein the second conductive layer includes any one of gold, platinum, and copper.

5. An electronic component electrically connected to the semiconductor device of claim 1.

6. A semiconductor device fabrication process comprising:
    preparing a structure that includes: a semiconductor substrate that has a first surface and a second surface opposite to the first surface; an electrode provided on the first surface of the semiconductor substrate; and an insulating film provided on the first surface of the semiconductor substrate, the insulating film including an aperture at least partly overlapping the electrode;
    forming a resin bump on the insulating film; and
    forming a wiring layer electrically connected to the electrode, the wiring layer that includes a first conductive layer, an intermediate layer, and a second conductive layer, wherein
    the forming the wiring layer further includes:
        forming the first conductive layer on the electrode and on the resin bump;
        forming the intermediate layer on the first conductive layer by oxidizing or nitriding an upper surface of the first conductive layer; and
        forming the second conductive layer on the intermediate layer.

7. The semiconductor device fabrication process according to claim 6, wherein
    the wiring layer further includes a base layer formed between the first conductive layer and the resin bump, the forming the wiring layer further include:
        forming an additional conductive layer, which has the same material as the first conductive layer, on the resin bump before the first conductive layer is formed; and
        heating the additional conductive layer in an atmosphere of oxygen or nitride so as to form the base layer.

8. The semiconductor device fabrication process according to claim 6, wherein
    the wiring layer further includes a base layer formed between the first conductive layer and the resin bump, and
    the forming the wiring layer further include heating the first conducting layer in an atmosphere of oxygen or nitride so as to change a bottom surface of the first conductive layer into a base layer formed between the first conductive layer and the resin bump, and change the upper surface of the first conductive layer into the intermediate layer.

9. An electronic component fabrication process comprising:
    preparing a semiconductor device fabricated by the semiconductor device fabrication process of claim 6; and
    electrically connecting the semiconductor device to a wiring substrate.

* * * * *